(12) United States Patent
Schoen et al.

(10) Patent No.: US 9,136,952 B2
(45) Date of Patent: Sep. 15, 2015

(54) PULSE AMPLITUDE MODULATION (PAM) BIT ERROR TEST AND MEASUREMENT

(71) Applicant: Tektronix, Inc., Beaverton, OR (US)

(72) Inventors: Kipp J. Schoen, Longmont, CO (US); Joseph N. Allen, Broomfield, CO (US)

(73) Assignee: TEKTRONIX, INC., Beaverton, OR (US)

( * ) Notice: Subject to any disclaimer, the term of this patent is extended or adjusted under 35 U.S.C. 154(b) by 0 days.

(21) Appl. No.: 14/158,768

(22) Filed: Jan. 17, 2014

(65) Prior Publication Data

US 2015/0207574 A1 Jul. 23, 2015

(51) Int. Cl.
*H04B 17/00* (2015.01)
*H04L 27/06* (2006.01)

(52) U.S. Cl.
CPC ............... *H04B 17/00* (2013.01); *H04L 27/06* (2013.01)

(58) Field of Classification Search
CPC ................. H04L 1/004; H04L 7/0334; H04L 2025/03363; H04L 25/065; H04L 25/066; H04L 27/06; H04B 17/00; H04B 17/0042; H03M 13/03
USPC ......... 375/224, 264, 268, 286, 287, 300, 316, 375/317, 320
See application file for complete search history.

(56) References Cited

U.S. PATENT DOCUMENTS

| | | | |
|---|---|---|---|
| 2002/0196510 A1* | 12/2002 | Hietala et al. | 359/189 |
| 2003/0177438 A1 | 9/2003 | Waschura et al. | |
| 2004/0086034 A1 | 5/2004 | Jungerman | |
| 2008/0181289 A1* | 7/2008 | Moll | 375/224 |
| 2013/0241622 A1* | 9/2013 | Zerbe et al. | 327/323 |

OTHER PUBLICATIONS

International Search Report and Written Opinion for Application No. PCT/US2015/011807, Dated Apr. 7, 2015, 12 pages.

* cited by examiner

*Primary Examiner* — Leon Flores
(74) *Attorney, Agent, or Firm* — Marger Johnson

(57) ABSTRACT

A method and apparatus are provided to detect a threshold-error of a multi-level signal-under-test. In one aspect of the disclosure, a digital test sequence may be used to produce the signal-under-test. In one aspect, the digital test sequence may be mapped to M binary reference sequences, wherein M is greater than one. In one aspect, each of the M binary reference sequences may be associated with a voltage threshold and a received signal may be bit-compared with each threshold. In one aspect, a threshold-error may be counted when a bit of a binary reference sequence does not match the corresponding bit-compare result. In one aspect, an instrument is provided that compares a received amplitude to a plurality of thresholds at one sample time.

16 Claims, 11 Drawing Sheets

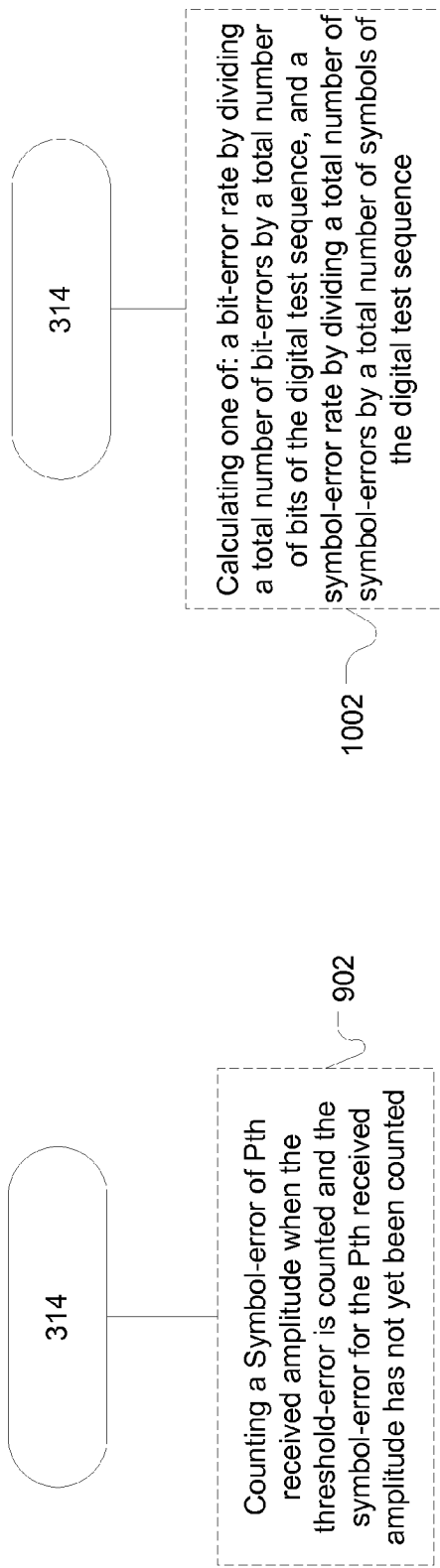

FIGURE 9

Counting a Symbol-error of Pth received amplitude when the threshold-error is counted and the symbol-error for the Pth received amplitude has not yet been counted — 902

FIGURE 10

Calculating one of: a bit-error rate by dividing a total number of bit-errors by a total number of bits of the digital test sequence, and a symbol-error rate by dividing a total number of symbol-errors by a total number of symbols of the digital test sequence — 1002

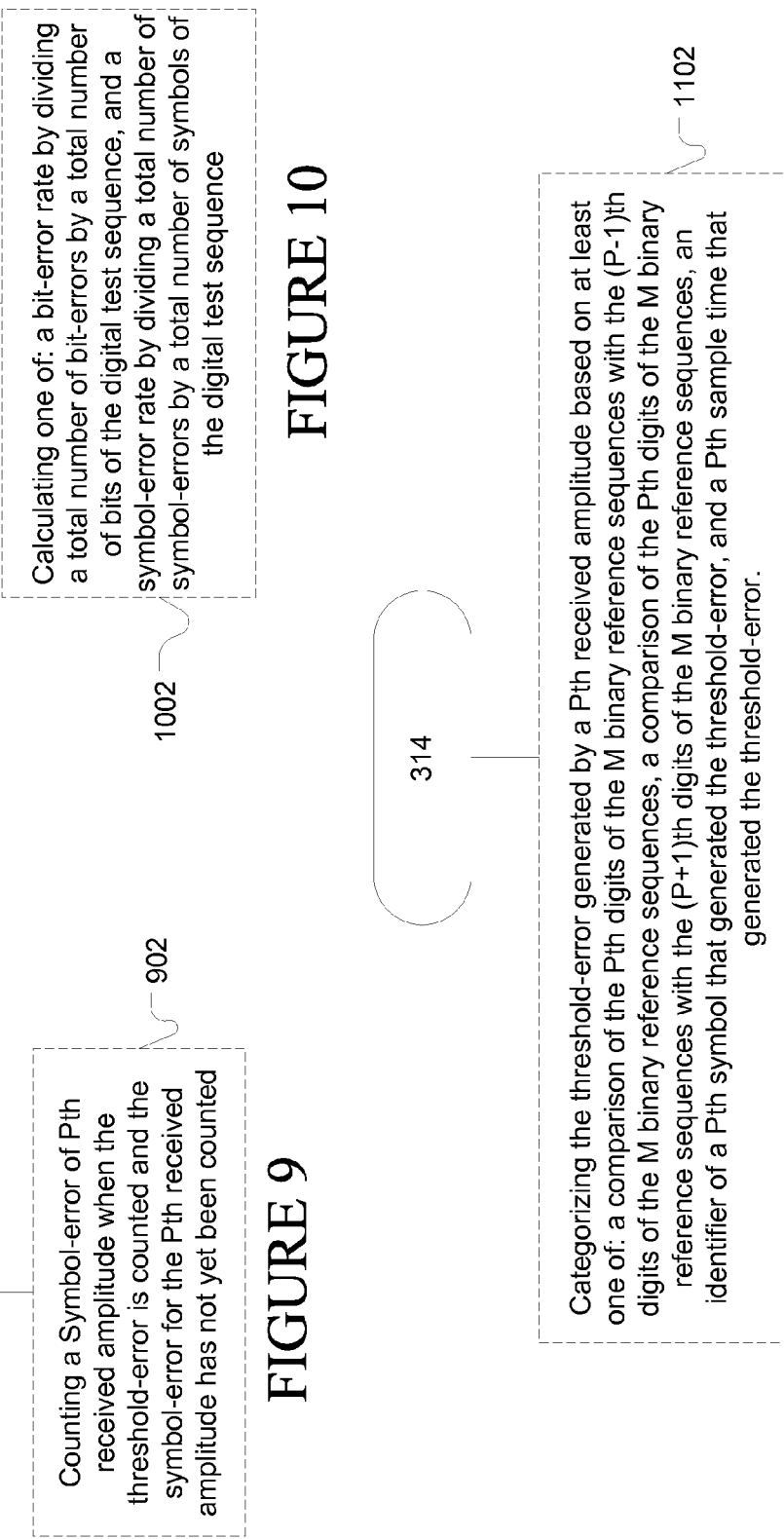

FIGURE 11

Categorizing the threshold-error generated by a Pth received amplitude based on at least one of: a comparison of the Pth digits of the M binary reference sequences with the (P-1)th digits of the M binary reference sequences, a comparison of the Pth digits of the M binary reference sequences with the (P+1)th digits of the M binary reference sequences, an identifier of a Pth symbol that generated the threshold-error, and a Pth sample time that generated the threshold-error. — 1102

PULSE AMPLITUDE MODULATION (PAM) BIT ERROR TEST AND MEASUREMENT

FIELD OF TECHNOLOGY

The disclosure relates to test and measurement and in particular to test and measurement of multi-level and pulse amplitude modulated (PAM) signals.

BACKGROUND

Error Detector (ED) instruments may measure and characterize errors in communication signals. The majority of ED equipment is designed for data that is encoded into pulses of two (binary) stable amplitudes. The majority of ED equipment is designed to bit-compare a sampled signal to only one threshold in a given moment. In contrast, pulse amplitude modulation (PAM) encodes data into pulses of M+1 stable amplitudes, wherein M+1 may be greater than two. Error detection in PAM signals thus necessitates new test equipment and new test methods.

SUMMARY

Disclosed herein are methods of using ED instruments to test and measure a threshold-error, symbol-error, and bit-error of a PAM signal-under-test (SUT). In one embodiment, a method comprises defining a lossless mapping from a digital test sequence to M binary reference sequences, wherein M is an integer greater than one. For example, the digital test sequence may be a test pattern before it is encoded by pulse amplitude modulation and the M binary reference sequences may define the relationship of each pulse of the PAM encoded test pattern to the M voltage thresholds that separate the M+1 stable amplitudes of the PAM modulation. Another step of the method may comprise configuring a first error detection channel of an ED instrument with a first voltage threshold and a first binary reference sequence of the M binary reference sequences. For example the first voltage threshold may be a first of the M voltage thresholds that separate the M+1 stable amplitudes of the PAM modulation, and the first binary reference sequence may define the relationship of the PAM modulated test pattern to the first threshold. Another step of the method may comprise communicatively coupling the first channel to receive the signal-under-test. Further steps may comprise communicating the digital test sequence to at least the first channel, receiving a first received amplitude, resolving the first received amplitude to a first received level based on the received amplitude's bit-compare relationship to the first voltage threshold, and counting a threshold error if the first received level does not match the corresponding digit of the first binary reference sequence as defined by the mapping.

Also disclosed herein are ED instruments used to test and measure a threshold-error, symbol-error, and bit-error of a multi-level or PAM signal-under-test. In one embodiment, an ED instrument simultaneously compares a received pulse to a plurality of thresholds at one sample time or with one sample.

BRIEF DESCRIPTION OF THE DRAWING

The foregoing summary, as well as the following detailed descriptions, are better understood when read in conjunction with the appended drawings. The drawings illustrate the disclosure, however, the invention is not limited to the specific methods and instrumentalities drawn or disclosed. In the drawing:

FIG. 9 is a block diagram of an error detection instrument.

FIG. 10 is a further block diagram of an error detection instrument.

FIG. 11 is a further block diagram of an error detection instrument.

DETAILED DESCRIPTION

Multi-level signaling or pulse amplitude modulation may be used to translate digital data into a continuous time signal for transmission. PAM modulated data comprises pulses wherein the pulse amplitudes carry the information of the digital data. PAM modulation may be combined with other encoding, modulation, error detection, and error correction schemes.

Digital data may be mapped, using a simple or complex algorithm, into M sequences of binary digits, where M is greater than one and the mapping is lossless. PAM encoding of digital data may comprise mapping a sequence of digital symbols to M+1 amplitudes such that each digital symbol may be uniquely defined by its time position in the continuous time transmission and its amplitude as compared to M thresholds that separate the M+1 amplitudes. In one embodiment, a multi-level signal comprises a continuous-time signal comprising pulses of varying amplitudes wherein a pulse amplitude is defined to represent: a first digital symbol when the pulse amplitude is less than both an alpha threshold and a beta threshold, a second digital symbol when the pulse amplitude is less than the alpha threshold and greater than the beta threshold, and a third digital symbol when the pulse amplitude is greater than both the alpha threshold and the beta threshold. Additional thresholds may be used to define additional digital symbols.

Figure 1:
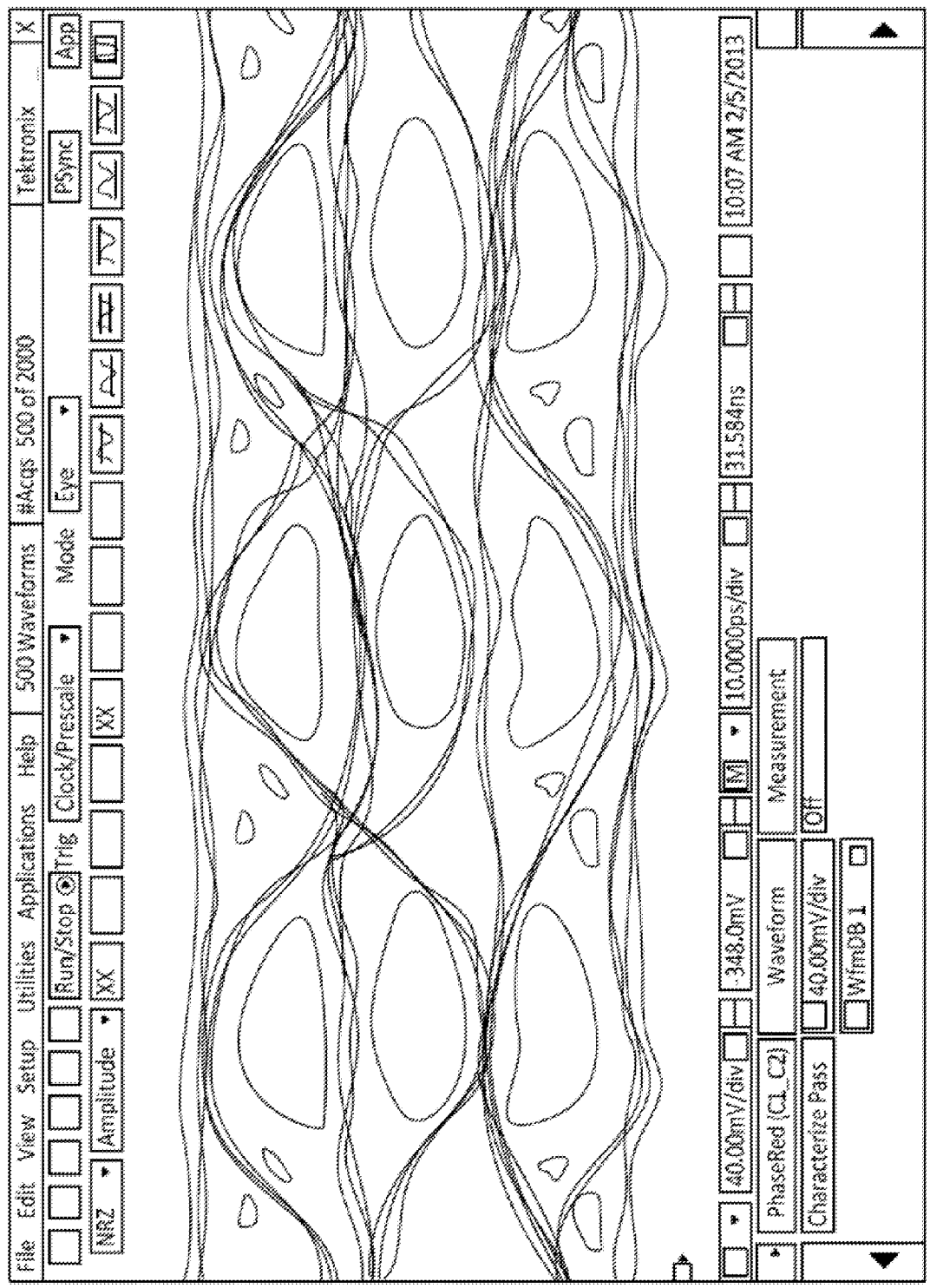
FIG. 1 shows a repetitively sampled PAM-4 signal.
Figure 2:
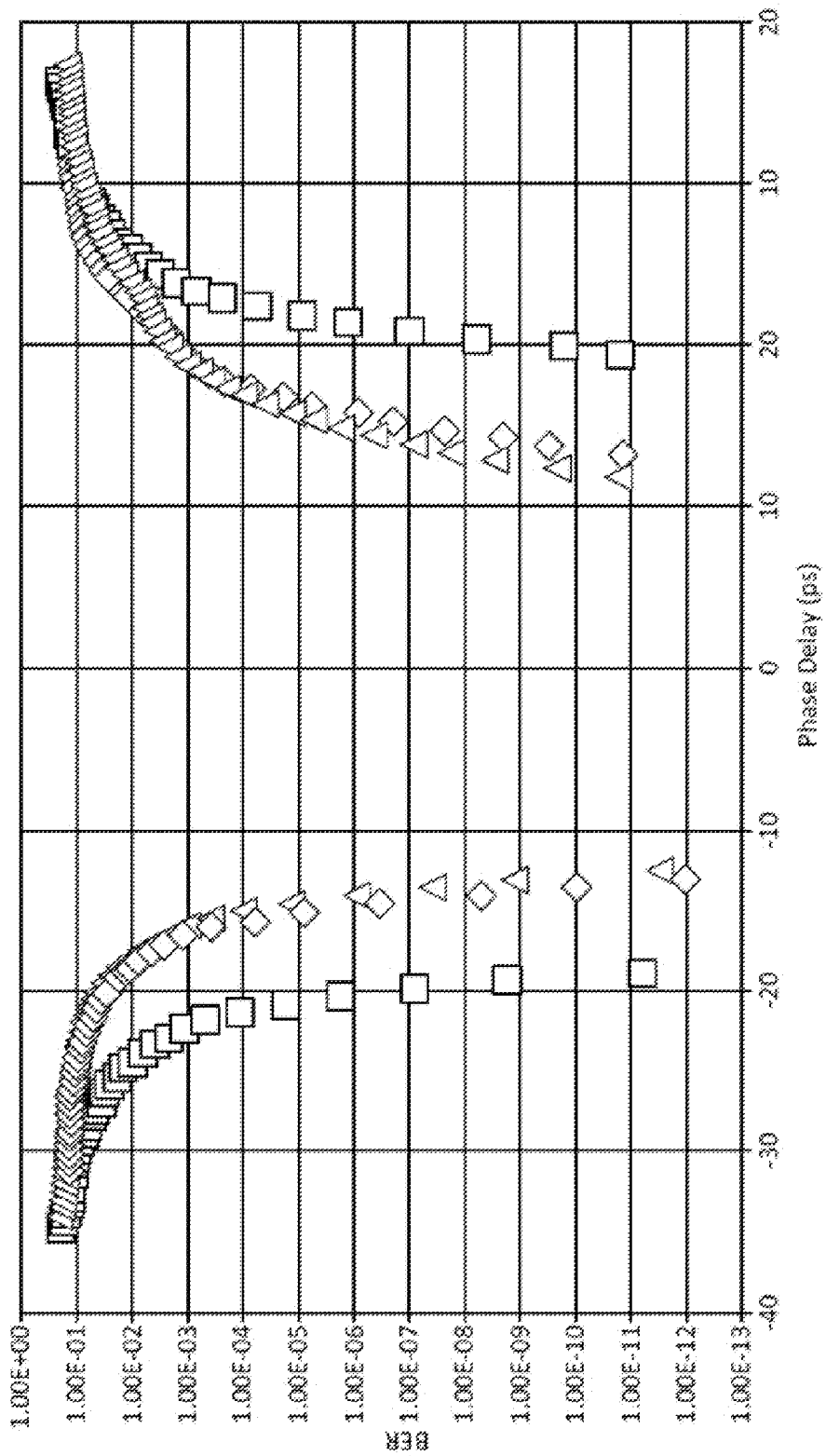
FIG. 2 shows a plot of bit-error rate vs. phase delay for three binary reference sequences of a PAM-4 signal wherein the triangle symbols represent a first binary reference sequence, the diamond symbols represent a second binary reference sequence, and the square symbols represent a third binary reference sequence.

For example, digital data consisting of the symbols a, b, c, and d may be represented by 4-level PAM (PAM-4) encoding defined by a first, second, and third voltage threshold (e.g. −5V, 0V, +5V) wherein a is defined as an amplitude that is e.g. less than the first, second, and third threshold; b is defined as an amplitude that is e.g. greater than the first threshold and less than the second and third thresholds; c is defined as an amplitude that is e.g. greater than the first and second thresholds and less than the third threshold; and d is defined as an amplitude that is e.g. greater than the first, second, and third threshold. FIG. 1 illustrates a received PAM4 signal that has been repetitively sampled using the data rate to trigger the horizontal sweep. In this example, if "less than" is represented as 0 and "greater than" is represented as 1 then a digital test sequence consisting of "aabbccdd" may be mapped to three binary reference sequences that enumerate the relationship of each symbol of the digital test sequence to the three thresholds: "00111111" for the first threshold, "00001111" for the second threshold, and "00000011" for the third threshold. In this example, the mapping from the digital test sequence to the three binary reference sequences is lossless because no information is lost when the digital test sequence is mapped to the three binary thresholds. In this example, there is a one-to-one mapping between the eight symbols of the digital test sequence "aabbccdd" and the eight digits of each binary reference sequence, and the order of the digits in the binary reference sequences is the same as the order of the symbols in the digital test sequence. Thus, in this example, the mapping is degenerate and in some embodiments the mapping may be implemented with a null, implicit, or default mapping.

In one embodiment, some digits of a binary reference sequence may be redundant. In the PAM-4 example, if a pulse amplitude is determined to be less than the lowest voltage threshold (e.g. the first voltage threshold) it is redundant to test whether the amplitude is less than the other voltage thresholds. Furthermore, if a binary reference sequence reveals an error in one symbol of a digital test sequence there may be limited value in finding additional errors in the same symbol unless the magnitude of the symbol-error is valuable. In one embodiment, a binary reference sequence may comprise a means to indicate when a bit-compare may be unnecessary. For example, an X in a binary reference sequence may indicate an unnecessary bit-compare (e.g. "0011XXXX" for the first threshold).

In another example, digital data consisting of the symbols 00, 01, and 10 may be represented by 3-level PAM (PAM-3) encoding defined by a first and second voltage threshold (e.g. 0V, +3.3V) wherein 00 is defined as an amplitude that is e.g. less than the first and second threshold; 01 is defined as an amplitude that is e.g. greater than the first and less than the second threshold; and 10 is defined as an amplitude that is e.g. greater than the first and second threshold. In this example, if "less than" is again represented as 0 and "greater than" is again represented as 1, then a digital test sequence consisting of "00010110" may be mapped to two binary reference sequences that enumerate the relationship of each symbol of the digital test sequence to the two thresholds: "0111" for the first threshold, and "0001" for the second threshold. In this example, the mapping from the digital test sequences to the three binary reference sequences is lossless because no information is lost when the digital test sequences are mapped to the three binary thresholds. However, if the symbol 11 were an element of the digital data and the digital test sequence were "11001100" then the mapping from the digital test sequence to the binary reference sequences would not be lossless because the digital test sequence could not be mapped without further mapping instructions. Furthermore, in this example, there is a one-to-one mapping between the four symbols of the digital test sequence "00010110" and the four digits of each binary reference sequence and the order of the digits in the binary reference sequences is the same as the order of the symbols in the digital test sequence. Thus, in this example, the mapping is degenerate and in some embodiments the mapping may be implemented with a null, implicit, or default mapping.

In yet another example, digital data consisting of the octal symbols 0, 1, 2, 3, 4, 5, 6, and 7 may be represented by 8-level PAM (PAM-8) encoding defined by a first through seventh voltage threshold wherein each symbol is encoded to an amplitude that is only greater than all of the thresholds up to the one with the same octal name as the symbol (e.g. 0 is encoded as an amplitude that is less than all thresholds, e.g. 2 is encoded as an amplitude that is greater than only the first and second thresholds, and 6 is encoded as an amplitude that is greater than only the first through sixth thresholds). In this example, though, a forward error correction scheme is used so the octal data is not modulated in the order of the symbols. In this example, moving left-to-right through the digital test sequence, each four symbol word is modulated three times, first in left-to-right order, then in right-to-left order, then in first/third/second/forth order. So, if "less than" is again represented as 0 and "greater than" is again represented as 1, then a two-word digital test sequence consisting of "02461357" may be mapped to seven binary reference sequences that enumerate the relationship of each symbol of the digital test sequence to the seven thresholds using the described mapping: "011111100111111111111111" for the first threshold, "011111100110111111100111" for the second threshold, "001111000101011111100111" for the third threshold, "001111000101001111000101" for the fourth threshold, "000110000001001111000101" for the fifth threshold, "000110000001001111000101" for the sixth threshold, and "000000000000000110000001" for the seventh threshold. In this example, the symbols are PAM modulated in the following order: "024664200426135775311537". In this example, the mapping is lossless because no information is lost when the digital test sequence is mapped to the seven binary thresholds. In this example, there is not a one-to-one mapping between the eight symbols of the digital test sequence "02461357" and the twenty-four digits of each binary reference sequence, and the order of the digits in the binary reference sequences is not the same as the order of the symbols in the digital test sequence.

Figure 3:
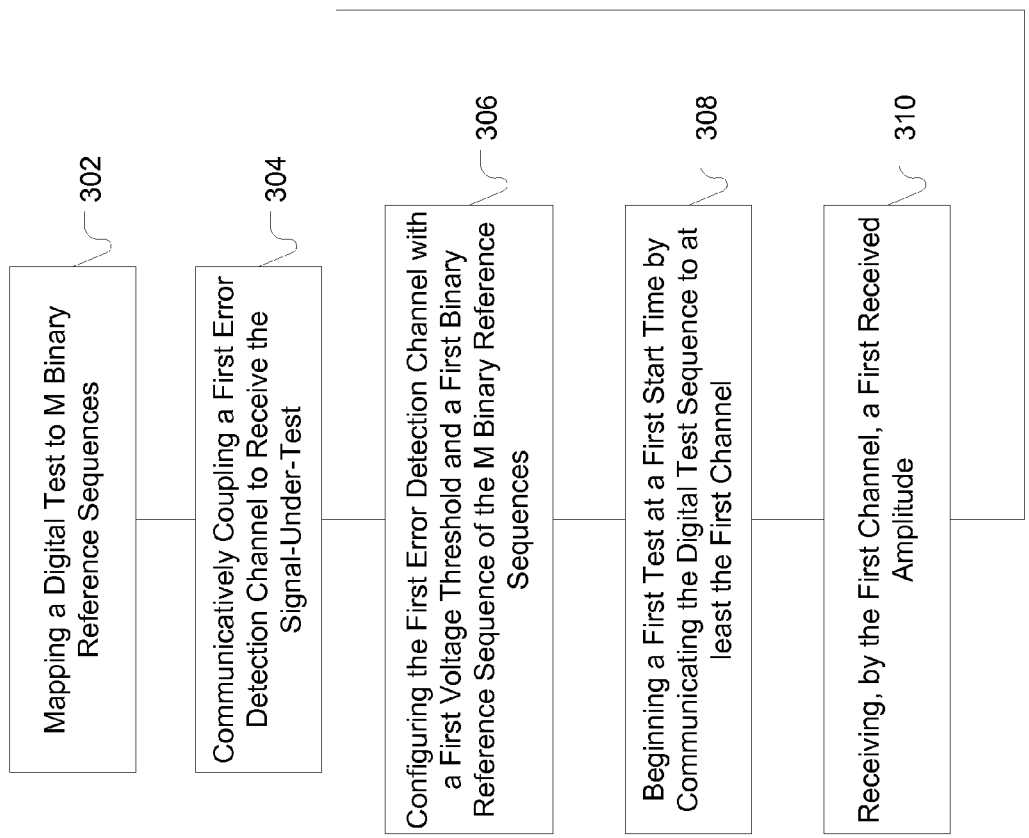
FIG. 3 is a flow chart of a method of detecting a threshold-error of a multi-level signal-under-test using an error detection instrument.

In one embodiment, as shown in FIG. 3, a method of detecting a threshold-error of a multi-level signal-under-test using an error detector (ED) instrument comprises mapping at 302 a digital test sequence to M binary reference sequences, wherein M is an integer greater than one. In one embodiment the mapping is lossless. In one embodiment, the mapping may duplicate a modulation that is implemented by a design-under-test as it produces the signal-under-test. In one embodiment, the M binary reference sequences may act as reference test patterns for ED instruments that perform error detection using bit (i.e. binary) comparisons. In one embodiment the M binary reference sequences may be encoded e.g. for compression.

Figure 5:
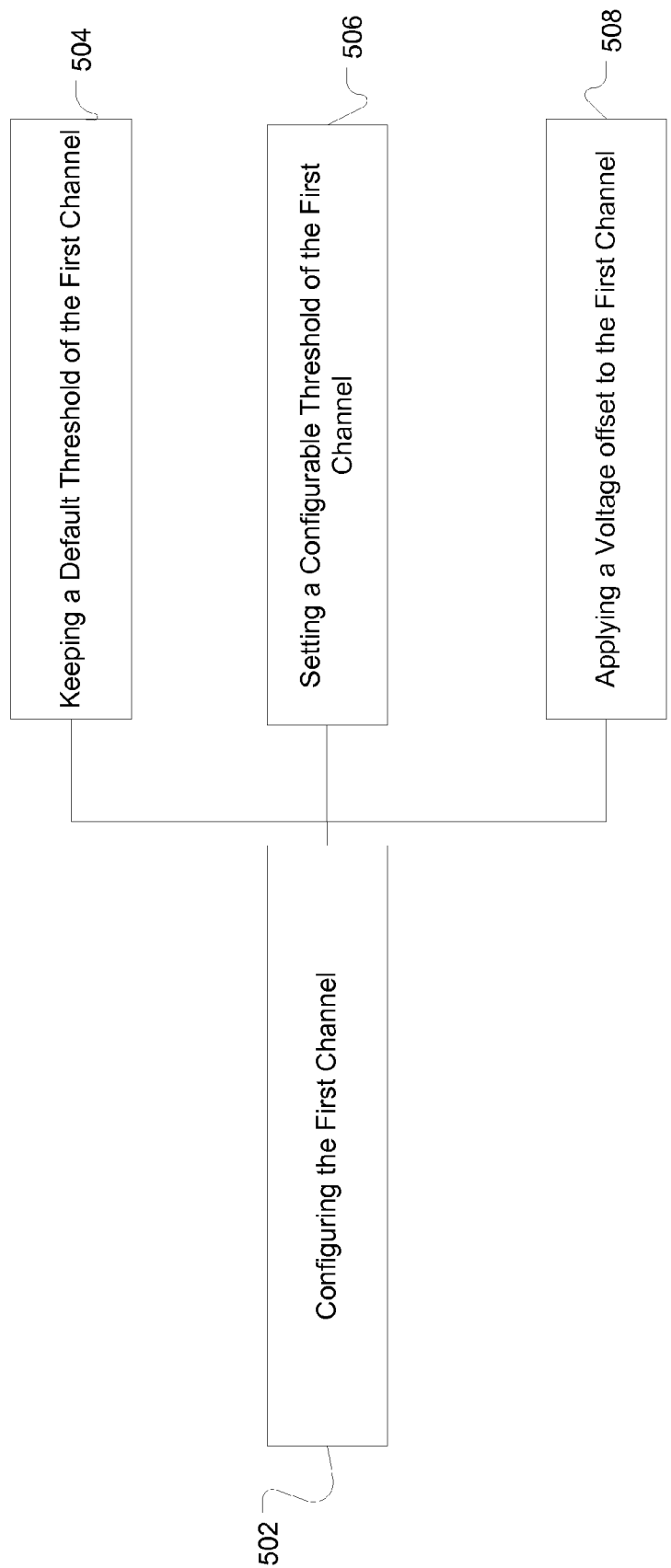
FIG. 5 is a flow chart of a method for configuring a first channel.

In one embodiment the method may further comprise configuring at 306 a first error detection channel of an ED instrument with a first voltage threshold and a first binary reference sequence of the M binary reference sequences. In the PAM-4 example above, a first error detection channel of an ED instrument may be configured with the first voltage threshold (e.g. −5V) and the first binary reference sequence (e.g. "00111111"). Continuing the PAM-4 example, the first channel may compare a PAM-4 modulated digital test pattern (e.g. "aabbccdd") with the first voltage threshold, recording a 1 when a received PAM pulse exceeds the threshold and a 0 when a modulated pulse does not exceed the threshold, and bit-comparing the resulting bit pattern with the first binary reference sequence (e.g. "00111111"). In this example, the first binary reference sequence (e.g. "00111111") may act as a reference test pattern for the first channel and a threshold-error may be recorded if any bit result produced by the threshold comparison is not the same as the corresponding bit of the reference test pattern. In this example, a second error detection channel of an ED instrument (the same instrument or a different instrument) may be configured with the second voltage threshold (e.g. 0V) and the second binary reference sequence; and a third error detection channel of an ED instrument (the same instrument or a different instrument) may be configured with the third voltage threshold (e.g. 5V) and the third binary reference sequence. FIG. 5 illustrates configuring the first channel. In one embodiment, configuring at 502 the first error detection channel of the instrument with the first voltage threshold may comprise keeping a default threshold of the first channel. In one embodiment, configuring at 504 the first error detection channel of the instrument with the first voltage threshold may comprise setting a configurable threshold of the first channel. In one embodiment, configuring at 506 the first error detection channel of the instrument with the first voltage threshold may comprise applying at 508 a voltage offset to the first channel.

In one embodiment, the method may further comprise communicatively coupling at 304 the first channel to receive the signal-under-test. In one embodiment, a PAM signal-under-test may be configured as an input to the first channel.

In one embodiment, the method may further comprise beginning at 308 a first test at a first start time by communicating the digital test sequence to at least the first channel. In one embodiment the digital test sequence may be PAM encoded as part of communicating the digital test sequence. In one embodiment a beginning sequence or synchronization signal may precede the beginning of each test. In one embodiment, the signal-under-test may be subjected to noise as it is communicated.

In one embodiment, the method may further comprise receiving at 310, by the first channel, a first received amplitude. In the PAM-4 example above, the first channel may receive the signal-under-test comprising a PAM pulse (e.g. symbol "a" is modulated to an amplitude that is less than the first, second, and third thresholds and so is modulated to an amplitude that is less than −5V).

In one embodiment, the method may further comprise resolving at 312, by the first channel at a first sample time, a first received level wherein the first channel resolves the first received level as a first binary value when the first received amplitude is greater than the first threshold and resolves the first received level as a second binary value when the first received amplitude is less than the first threshold. In the PAM-4 example above, "less than" is represented as 0 and "greater than" is represented as 1 so at time "t" the first channel resolves a pulse with an amplitude that is less than −5V as a 0.

In one embodiment, the method may further comprise counting at 314 a threshold-error of the signal-under-test if the first received level of the first received amplitude does not match a first corresponding digit of the first binary reference sequence, wherein the first corresponding digit is defined by the mapping. In the PAM-4 example above, if the first channel, using the first voltage threshold, resolves the signal-under-test as "0011_0111" when the first binary reference sequence configured to the first channel is "00111111" then a threshold-error may be recorded. In one embodiment a symbol-error may be counted when a threshold-error is counted but only one error is counted per symbol of the digital test sequence. Continuing the PAM-4 example, if the second channel, using the second voltage threshold, resolves the signal-under-test as "00000_111" when the second binary reference sequence configured to the second channel is "00001111" then another symbol-error may not be recorded. In one embodiment the error may be a bit-error when only one error is counted per bit of information inherent in each symbol of the digital test sequence. Continuing the PAM-4 example, at least one bit-error may be counted when two threshold errors are counted for the same symbol, but a second bit-error may generally not be counted without knowledge of the bit-encoding of the symbols. In one embodiment a channel may be configured with a bit encoding knowledge. A symbol-error rate may be calculated by dividing the number of symbols received in error by the number of symbols transmitted. A bit-error rate may be calculated by dividing the number of bits received in error by the number of bits transmitted. Continuing the PAM-4 example, if there are no errors other than the one counted above by the first channel, then the symbol-error rate of this test may be ⅛ and the bit-error rate may be 1/16.

Figure 6:
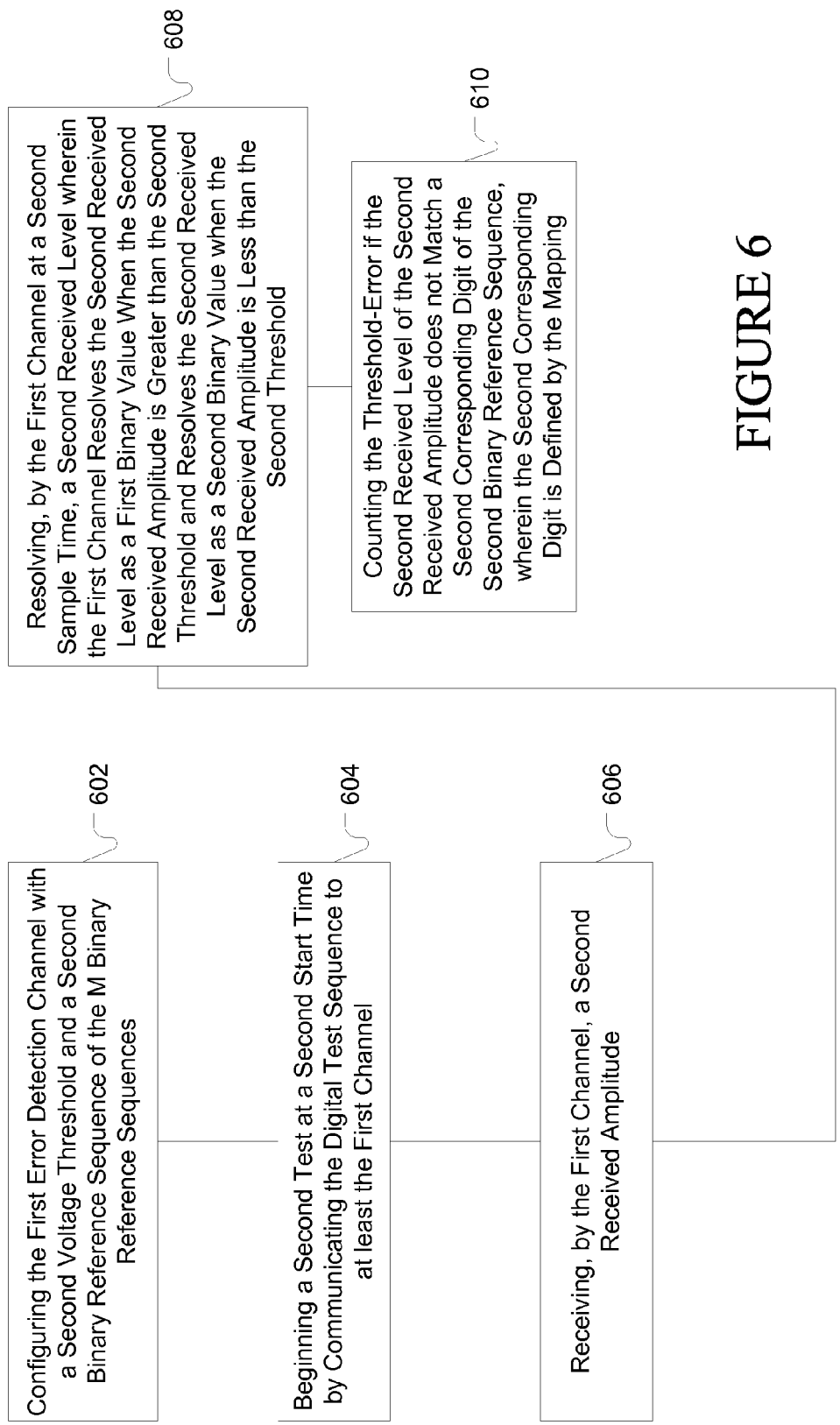
FIG. 6 is a flow chart of a method of detecting a threshold-error of a multi-level signal-under-test using an error detection instrument.

In one embodiment, as illustrated in FIG. 6, the method may further comprise configuring at 602 the first channel of the instrument with a second voltage threshold and a second binary reference sequence of the M binary reference sequences. In one embodiment, the method may further comprise beginning at 604 a second test at a second start time by communicating the digital test sequence to at least the first channel. In one embodiment, the method may further comprise receiving at 606, by the first channel, a second received amplitude. In one embodiment the first channel may be used to compare the signal-under-test with the first voltage threshold, then the signal-under-test may be received again and the first channel may be used again to compare the signal-under-test with the second voltage threshold. In one embodiment, if random noise is present the signal-under-test received by the first channel may vary slightly between the two runs, meaning that threshold-errors measured in the two runs may not be entirely correlated.

In one embodiment, the method may further comprise resolving at 608, by the first channel at a second sample time, a second received level wherein the first channel resolves the second received level as the first binary value when the second received amplitude is greater than the second threshold and resolves the second received level as the second binary value when the second received amplitude is less than the second threshold. In one embodiment, the method may further comprise counting at 610 a threshold-error if the second received level of the second received amplitude does not match a second corresponding digit of the second binary reference sequence, wherein the second corresponding digit is defined by the mapping. In the PAM-4 example, the first channel may be reconfigured with the second voltage threshold (e.g. 0V) and the second binary reference sequence (e.g. "00001111") prior to a second test, and if the first channel resolves the signal-under-test as "01_001111" then a threshold-error may be counted. In one embodiment, a symbol-error and bit-error may also be counted if appropriate.

Figure 4:
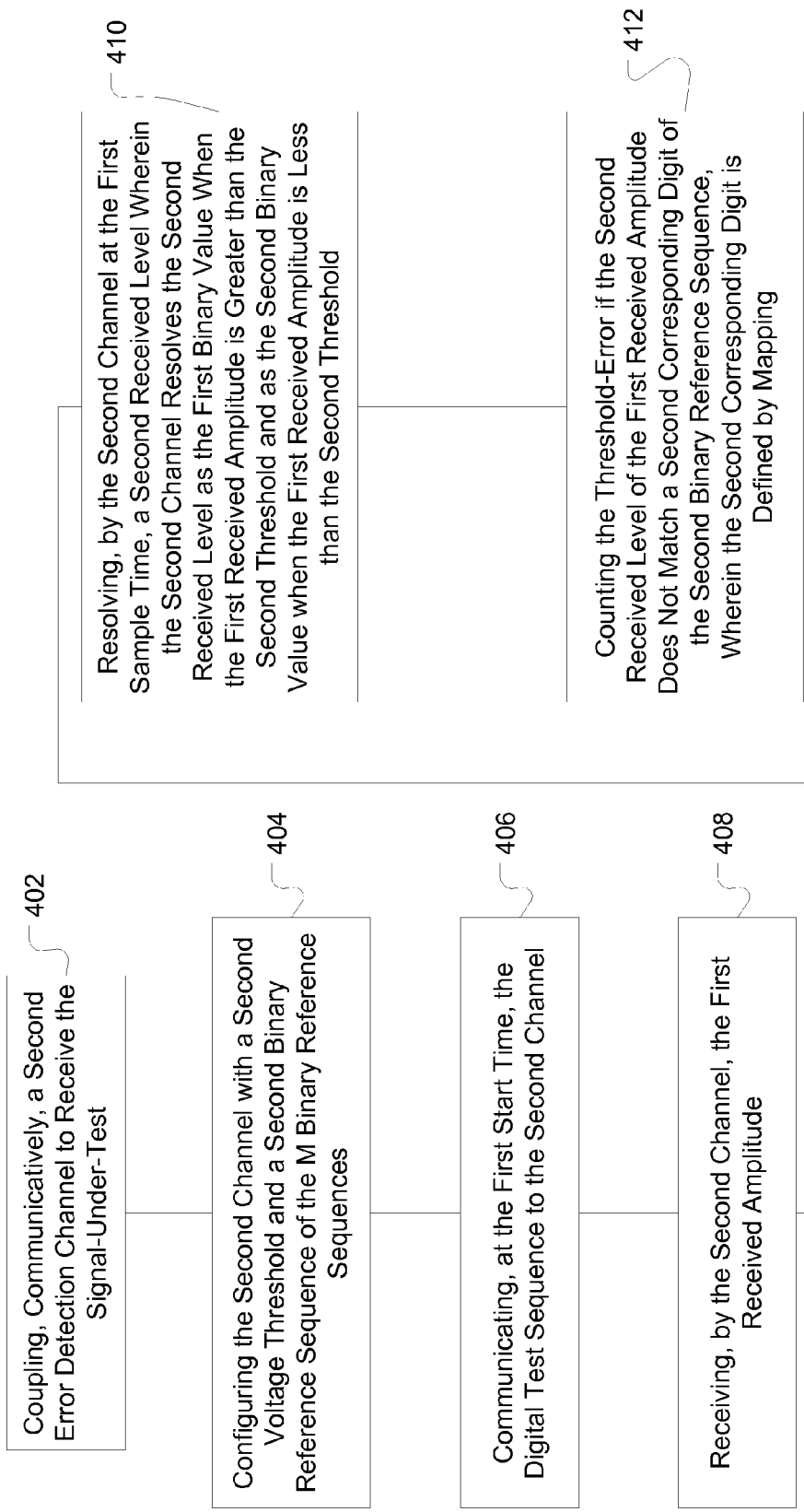
FIG. 4 is a flow chart of a method of detecting a threshold-error of a multi-level signal-under-test using an error detection instrument.

In one embodiment, as shown in FIG. 4, the method may further comprise configuring at 404 a second error detection channel with a second voltage threshold and a second binary reference sequence of the M binary reference sequences. In one embodiment, the method may further comprise communicatively coupling at 402 the second channel to receive the signal-under-test. In one embodiment, the method may further comprise communicating at 406, at the first start time, the digital test sequence to the second channel. In one embodiment, the method may further comprise receiving at 408, by the second channel, the first received amplitude. In one embodiment the first channel may be used to compare the signal-under-test with the first voltage threshold and a second channel (of the same or different instrument) may be used simultaneously to compare the signal-under-test with the second voltage threshold.

In one embodiment, the method may further comprise resolving at 410, by the second channel at the first sample time, a second received level wherein the second channel resolves the second received level as the first binary value when the first received amplitude is greater than the second threshold and as the second binary value when the first received amplitude is less than the second threshold. In one embodiment, the method may further comprise counting at 412 a threshold-error if the second received level of the first received amplitude does not match a second corresponding digit of the second binary reference sequence, wherein the second corresponding digit is defined by the mapping. In the PAM-4 example, the second channel may be configured at 404 with the second voltage threshold (e.g. 0V) and the second binary reference sequence (e.g. "00001111"), and if the second channel resolves the signal-under-test as "01001111" then a threshold-error may be counted. In one embodiment, symbol-error and bit-error may also be counted if appropriate.

Figure 7:
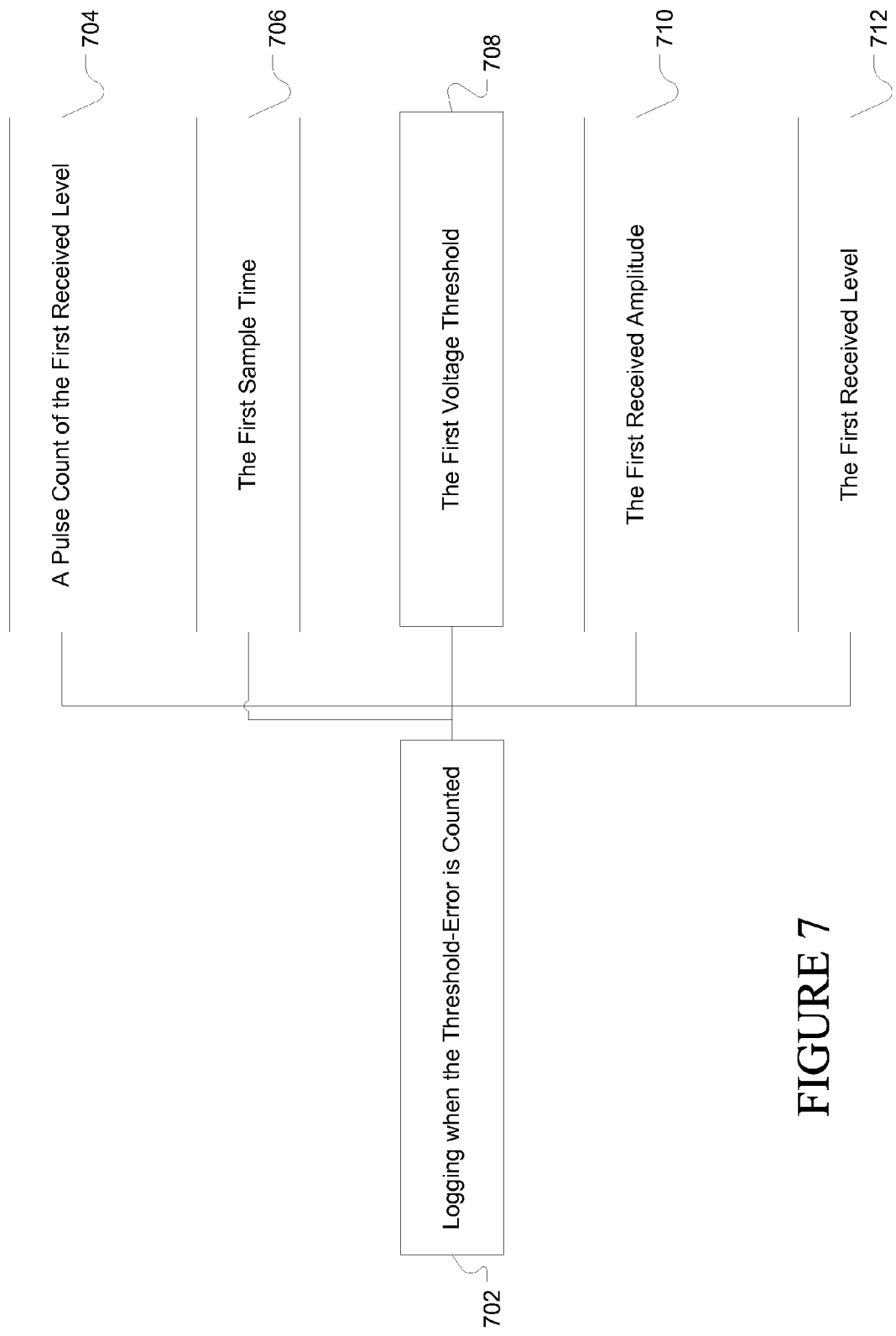
FIG. 7 is a flow chart of a method for logging when a threshold-error is counted.

In one embodiment, as shown in FIG. 7, the method may further comprise logging, when a threshold-error is counted at 702, at least one of: a pulse count of the first received level at 704, the first sample time at 706, the first voltage threshold at 708, the first received amplitude at 710, and the first received level at 712. Logging such information may enable useful analysis by the user. In the PAM-4 example above, if the first channel, using the first voltage threshold (e.g. −5V), resolves the signal-under-test as "00110111" when the first binary reference sequence configured to the first channel is "00111111" then the pulse count (e.g. 5) of the received error may be logged, the sample time of the fifth pulse may be logged, the voltage threshold (e.g. −5V) may be logged, the received amplitude may be logged (e.g. −7.5V), and the received level may be logged (e.g. 0).

Figure 8:
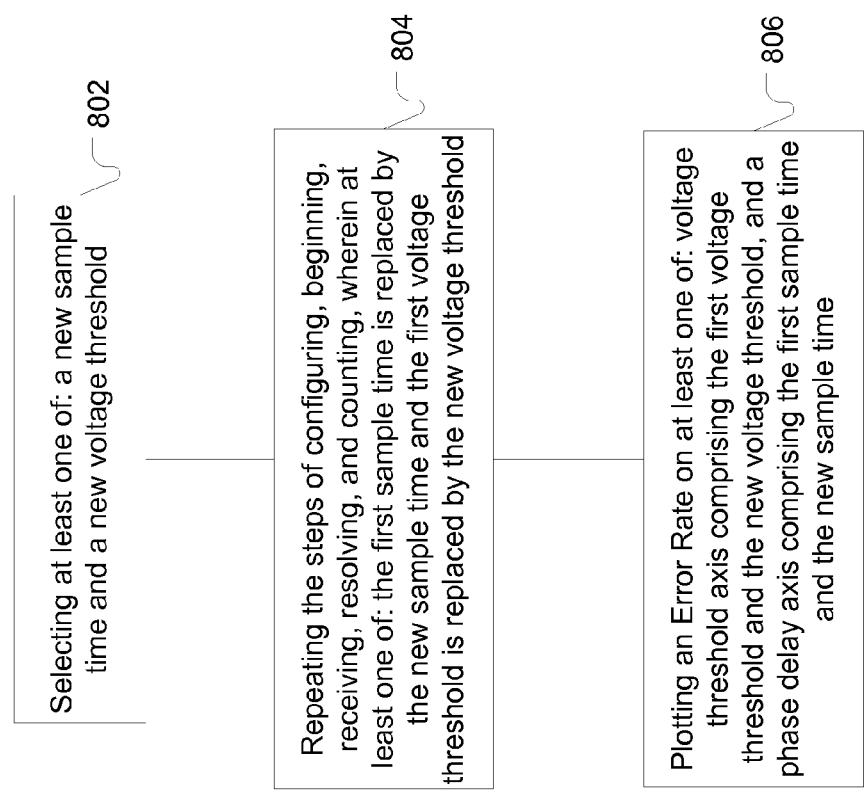
FIG. 8 if a flow chart of a method for selecting a new sample time and a new voltage threshold; repeating the steps of configuring, beginning, receiving, resolving, and counting; and plotting an error rate.

In one embodiment, as shown in FIG. 8, the method may further comprise selecting at least one of: a new sample time and a new voltage threshold at 802; repeating at 804 the steps of configuring, beginning, receiving, resolving, and counting wherein at least one of: the first sample time is replaced by the new sample time and the first voltage threshold is replaced by the new voltage threshold; and plotting at 806 an error rate on at least one of: a voltage threshold axis comprising the first voltage threshold and the new voltage threshold, and a phase delay axis comprising the first sample time and the new sample time (e.g. FIG. 1). In one embodiment, the threshold voltage and sample time (i.e. phase) may both be varied to create a contour plot of the symbol error rate or bit error rate as a function of both threshold voltage and phase.

In one embodiment, as shown in FIG. 9, the method may further comprise at 902 counting a symbol-error of a $P^{th}$ received amplitude when a threshold-error is counted and a symbol-error for the $P^{th}$ received amplitude has not yet been counted. In the PAM-4 example above, if the first channel, using the first voltage threshold, resolves the signal-under-test as "00110111" when the first binary reference sequence configured to the first channel is "00111111" then a threshold-error may be recorded. Continuing the example, if the second channel, using the second voltage threshold, resolves the signal-under-test as "00000111" when the second binary reference sequence configured to the second channel is "00001111" then another symbol-error may not be recorded. In this example, a symbol-error may be counted when the $5^{th}$ received amplitude generates a threshold-error in the first channel but another symbol-error may not be counted when the $5^{th}$ received amplitude generates a threshold-error in the second channel.

In one embodiment, as shown in FIG. 10, the method may further comprise at 1002 calculating one of: a bit-error rate by dividing a total number of bit-errors by a total number of bits of the digital test sequence, and a symbol-error rate by dividing a total number of symbol-errors by a total number of symbols of the digital test sequence.

In one embodiment, as shown in FIG. 11, the method may further comprise at 1102 categorizing the threshold-error generated by a $P^{th}$ received amplitude based on at least one of: a comparison of the $P^{th}$ digits of the M binary reference sequences with the $(P-1)^{th}$ digits of the M binary reference sequences, a comparison of the $P^{th}$ digits of the M binary reference sequences with the $(P+1)^{th}$ digits of the M binary reference sequences, an identifier of a $P^{th}$ symbol that generated the error, and a $P^{th}$ sample time that generated the error. In the PAM-4 example, if a threshold-error is counted for the $5^{th}$ received amplitude then that threshold-error may be categorized based on a comparison of the $4^{th}$ vs. $5^{th}$ or $5^{th}$ vs. $6^{th}$ digits of the M binary reference sequences. For example, if all M of the binary reference sequences have a different $4^{th}$ and $5^{th}$ digit then there is a large transition between the $4^{th}$ and $5^{th}$ amplitudes of the signal-under-test, and a large transition may be more susceptible to a threshold-error. In this example, a user may wish to categorize a threshold-error based on the size of the amplitude transition that preceded or followed the threshold-error, an identifier of the $P^{th}$ symbol (e.g. $5^{th}$), or a sample time of the $5^{th}$ sample.

Figure 12:
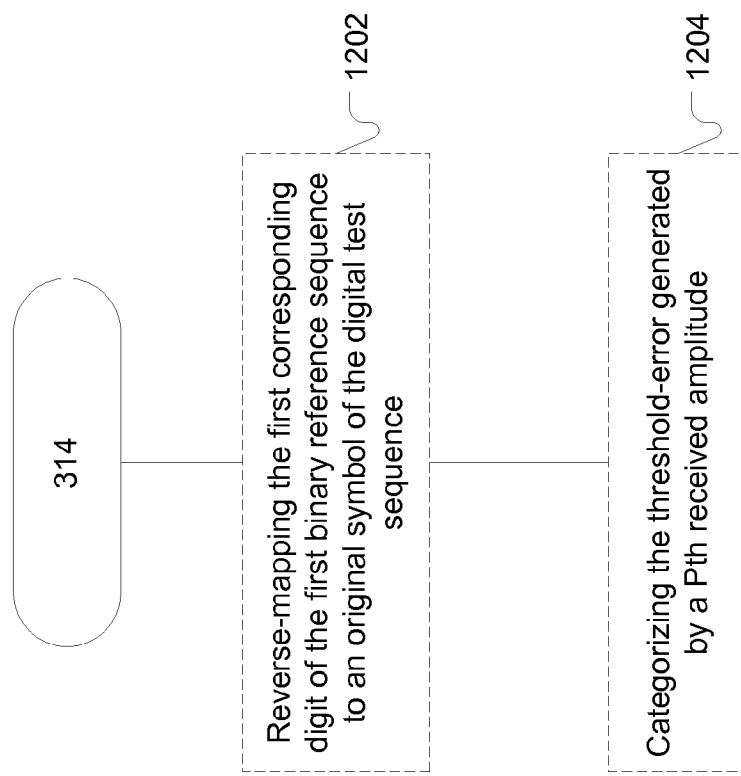
FIG. 12 is a further block diagram of an error detection instrument.

In one embodiment, as shown in FIG. 12, the method may further comprise at 1202 reverse-mapping the first corresponding digit of the first binary reference sequence to an original symbol of the digital test sequence. In the PAM-8 example, a reverse-mapping may map the fifth digit of the e.g. first binary reference sequence (e.g. "0111 11100111111111111111") to an original symbol of the digital test sequence (e.g. "02461357"). In one embodiment, the mapping and reverse-mapping may be identical. In one embodiment, the reverse-mapping may be logic, an algorithm, a software program, a macro, a selectable alternative, a database, a table, a list, or another symbolic means for describing the reverse-mapping. In one embodiment, the reverse-mapping may be a list wherein for each digit of a binary reference sequence there is a corresponding digit that indicates the ordinal position of its original symbol in the digital test sequence. In the PAM-8 example, the reverse-mapping for the first binary reference sequence may be e.g. "1234432113245678876555768". In the PAM-8 example, an alternative reverse-mapping for the binary reference sequences may be e.g. "123443211324" with the understanding that this pattern is applied to all the binary reference sequences and is repeated cyclically. In one embodiment, the mapping and the reverse-mapping account for a forward error correction scheme of the signal-under-test. In the PAM-8 example, each four symbol word is modulated three times in what may be a forward error correction scheme that employs redundancy to correct transmission errors.

In one embodiment, as also shown in FIG. 12, the method may further comprise at 1204 categorizing the threshold-error generated by a $P^{th}$ received amplitude based on whether the forward error correction scheme can correct the error. In the PAM-8 example, if the first channel receives e.g. "0111 01100111111111111111" when the first binary reference sequence is "01111110011111111111111111" then the threshold-error may be categorized as corrected or correctable because the two other correct transmissions of the symbol (e.g. 6) may be used to correct the error.

Figure 13:
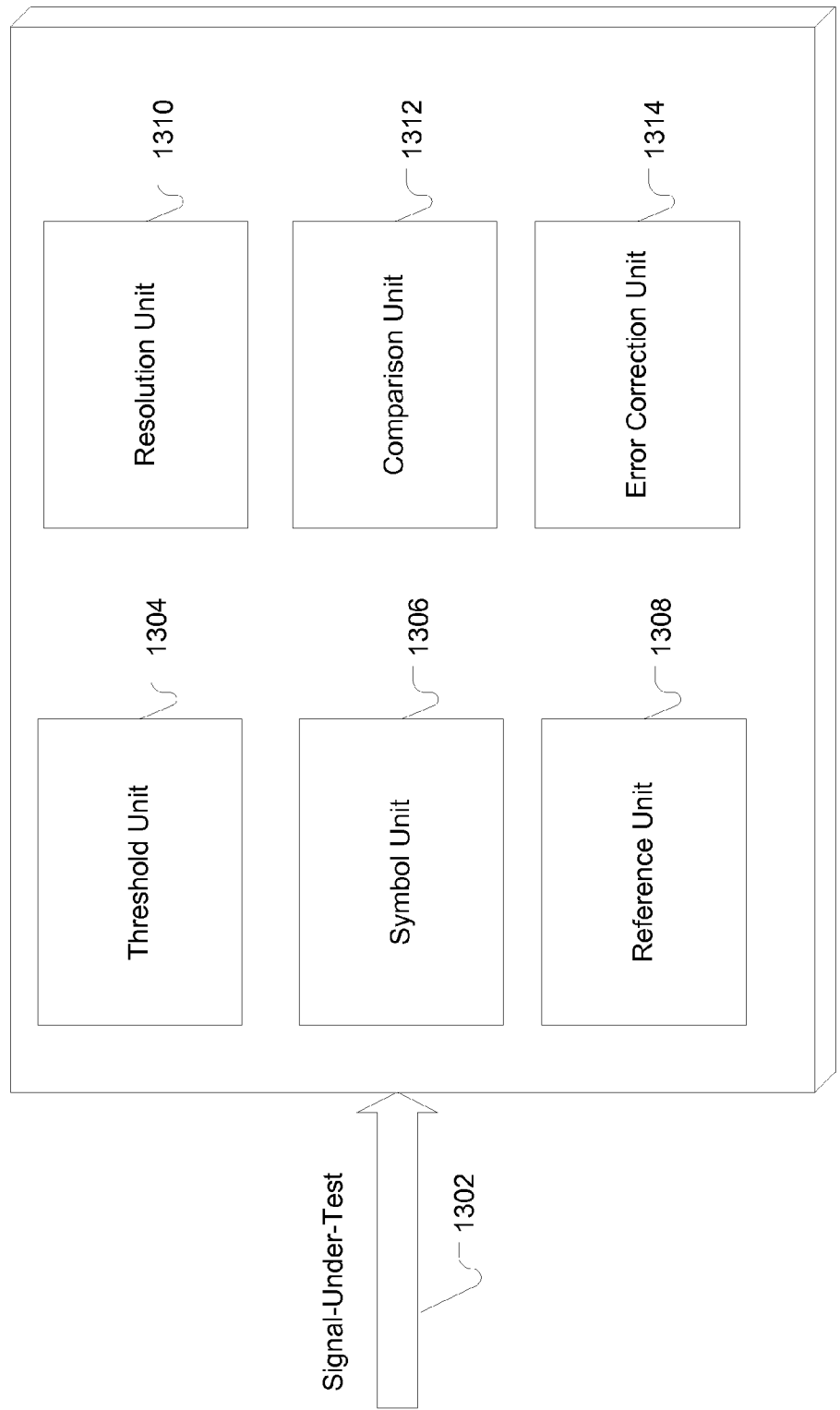
FIG. 13 is an example error detection instrument.

An error detector instrument as shown in FIG. 13 may be used to implement the methods disclosed. In one embodiment, an error detector instrument for detecting a threshold-error of a multi-level signal-under-test may comprise: at least one input (1302) to receive a received amplitude of a signal-under-test; a threshold unit (1304) of the input to store at least two voltage thresholds defining at least three voltage ranges; a symbol unit (1306) to associate a unique symbol with each of the voltage ranges; a reference unit (1308) to store a reference test sequence comprising a sequence of symbols; a resolution unit (1310) to compare, at a sample time, the received amplitude to the voltage thresholds and resolve the received amplitude to a received symbol, wherein the received symbol is the unique symbol associated with the voltage range of the received amplitude; and a comparison unit (1312) configured to compare the received symbol with a corresponding symbol of the reference test sequence and count a symbol-error if the received symbol does not match the corresponding symbol.

In one embodiment, an error detector instrument for detecting a threshold-error of a multi-level signal-under-test may comprise: at least one input channel to sample a received amplitude of a signal-under-test; a threshold unit to store two or more voltage thresholds; a reference unit to associate a binary reference sequence with each voltage threshold; a resolution unit to bit-compare, at a sample time, the received amplitude with each of the voltage thresholds and associate a bit-compare result with each voltage threshold; and a comparison unit to compare the bit-compare result of each voltage threshold with a corresponding bit of the associated binary reference sequence and count an error if the bit-compare result does not match the corresponding bit of the associated binary reference sequence.

In one embodiment, the instrument sensors, ADCs, demultiplexers, storage, and analysis may be synchronized such that two or more thresholds may be simultaneously compared or bit-compared with a received amplitude. In one embodiment one clock input may be shared such that two or more thresholds may be simultaneously compared or bit-compared with a received amplitude. In one embodiment one signal input may be shared such that two or more thresholds may be simultaneously compared or bit-compared with a received amplitude. In one embodiment, a memory of the instrument may store a reverse-mapping wherein the reverse-mapping indicates a symbol of the reference test sequence that corresponds to the received symbol. In one embodiment, the instrument further comprises an error correction unit (1314) configured to determine if a symbol-error or threshold-error generated by a $P^{th}$ received amplitude can be corrected by a forward error correction scheme of the signal-under-test.

The scope of the present invention is not limited to the embodiments disclosed herein. For example, the foregoing disclosure should by no means be construed so as to limit the scope of protection of the claims, or to otherwise imply that the inventive aspects of the illustrative embodiments are limited to the particular methods and apparatus disclosed. Moreover, as will be understood by those skilled in the art, many of the inventive aspects disclosed herein may be applied using test and measurement techniques not incorporated in embodiments discussed herein. In many cases, the place of implementation (i.e., the functional element) described herein is merely a designer's preference and not a hard requirement. Accordingly, except as they may be expressly so limited, the scope of protection of the claims is not intended to be limited to the specific embodiments described above. Furthermore, as used in this disclosure the conjunction "or" may be inclusive or exclusive.

What is claimed is:

1. A method of detecting a threshold-error of a multi-level signal-under-test using an error detector instrument, the method comprising: mapping a digital test sequence to M binary reference sequences, wherein M is an integer greater than one, and wherein the mapping is lossless; coupling, communicatively, a first error detection channel of the instrument to receive the signal-under-test; configuring the first channel with a first voltage threshold and a first binary reference sequence of the M binary reference sequences; beginning a first test at a first start time by communicating the signal-under-test to at least the first channel; receiving, by the first error detection channel, a first received amplitude of the signal-under-test; resolving, by the first error detection channel at a first sample time, a first received level wherein the first channel resolves the first received level as a first binary value when the first received amplitude is greater than the first threshold and resolves the first received level as a second binary value when the first received amplitude is less than the first threshold; and counting the threshold-error if the first received level of the first received amplitude does not match a first corresponding digit of the first binary reference sequence, wherein the first corresponding digit is defined by the mapping; configuring the first error detection channel of the instrument with a second voltage threshold and a second binary reference sequence of the M binary reference sequences; beginning a second test at a second start time by communicating the digital test sequence to at least the first error detection channel; receiving, by the first channel, a second received amplitude of the signal-under-test; resolving, by the first channel at a second sample time, a second received level wherein the first channel resolves the second received level as the first binary value when the second received amplitude is greater than the second threshold and resolves the second received level as the second binary value when the second received amplitude is less than the second threshold; and counting the threshold-error if the second received level of the second received amplitude does not match a second corresponding digit of the second binary reference sequence, wherein the second corresponding digit is defined by the mapping.

2. The method of claim 1 wherein configuring the first error detection channel of the instrument with the first voltage threshold comprises one of: keeping a default threshold of the first channel, setting a configurable threshold of the first channel, and applying a voltage offset to the first channel.

3. The method of claim 1 further comprising:
logging, when the threshold-error is counted, at least one of: a pulse count of the first received level, the first sample time, the first voltage threshold, the first received amplitude, and the first received level.

4. The method of claim 1 wherein the multi-level signal comprises a continuous-time signal comprising pulses of varying amplitudes wherein a pulse amplitude is defined to represent: a first digital symbol when the pulse amplitude is less than both an alpha threshold and a beta threshold, a second digital symbol when the pulse amplitude is less than the alpha threshold and greater than the beta threshold, and a third digital symbol when the pulse amplitude is greater than both the alpha threshold and the beta threshold.

5. The method of claim 1 further comprising:
counting a symbol-error of a Pth received amplitude when the threshold-error is counted and the symbol-error for the Pth received amplitude has not yet been counted.

6. The method of claim 1 further comprising:
calculating one of: a bit-error rate by dividing a total number of bit-errors by a total number of bits of the digital test sequence, and a symbol-error rate by dividing a total number of symbol-errors by a total number of symbols of the digital test sequence.

7. The method of claim 1 further comprising:
categorizing the threshold-error generated by a Pth received amplitude based on at least one of: a comparison of the Pth digits of the M binary reference sequences with the (P−1)th digits of the M binary reference sequences, a comparison of the Pth digits of the M binary reference sequences with the (P+1)th digits of the M binary reference sequences, an identifier of a Pth symbol that generated the threshold-error, and a Pth sample time that generated the threshold-error.

8. The method of claim 1 further comprising: reverse-mapping the first corresponding digit of the first binary reference sequence to an original symbol of the digital test sequence.

9. The method of claim 8 wherein the steps of mapping and reverse-mapping account for a forward error correction scheme of the signal-under-test.

10. The method of claim 9 further comprising:
categorizing the threshold-error generated by a Pth received amplitude based on whether the forward error correction scheme can correct the threshold-error.

11. A method of detecting a threshold-error of a multi-level signal-under-test using an error detector instrument, the method comprising: mapping a digital test sequence to M binary reference sequences, wherein M is an integer greater than one, and wherein the mapping is lossless; coupling, communicatively, a first error detection channel of the instrument to receive the signal-under-test; configuring the first error detection channel with a first voltage threshold and a first binary reference sequence of the M binary reference sequences; beginning a first test at a first start time by communicating the signal-under-test to at least the first error detection channel; receiving, by the first channel, a first received amplitude of the signal-under-test; resolving, by the first channel at a first sample time, a first received level wherein the first channel resolves the first received level as a first binary value when the first received amplitude is greater than the first threshold and resolves the first received level as a second binary value when the first received amplitude is less than the first threshold; and counting the threshold-error if the first received level of the first received amplitude does not match a first corresponding digit of the first binary reference sequence, wherein the first corresponding digit is defined by the mapping; coupling, communicatively, a second error detection channel to receive the signal-under-test; configuring the second error detection channel with a second voltage threshold and a second binary reference sequence of the M binary reference sequences; communicating, at the first start time, the signal-under-test to the second channel; receiving, by the second error detection channel, the first received amplitude; resolving, by the second error detection channel at the first sample time, a second received level wherein the second channel resolves the second received level as the first binary value when the first received amplitude is greater than the second threshold and as the second binary value when the first received amplitude is less than the second threshold; and counting the threshold-error if the second received level of the first received amplitude does not match a second corresponding digit of the second binary reference sequence, wherein the second corresponding digit is defined by the mapping.

12. A method of detecting a threshold-error of a multi-level signal-under-test using an error detector instrument, the method comprising: mapping a digital test sequence to M binary reference sequences, wherein M is an integer greater than one, and wherein the mapping is lossless; coupling, communicatively, a first error detection channel of the instrument to receive the signal-under-test; configuring the first error detection channel with a first voltage threshold and a first binary reference sequence of the M binary reference sequences; beginning a first test at a first start time by communicating the signal-under-test to at least the first channel; receiving, by the first error detection channel, a first received amplitude; resolving, by the first error detection channel at a first sample time, a first received level wherein the first error detection channel resolves the first received level as a first binary value when the first received amplitude is greater than the first threshold and resolves the first received level as a second binary value when the first received amplitude is less than the first threshold; and counting the threshold-error if the first received level of the first received amplitude does not match a first corresponding digit of the first binary reference sequence, wherein the first corresponding digit is defined by the mapping; selecting at least one of: a new sample time and a new voltage threshold; repeating the steps of configuring, beginning, receiving, resolving, and counting, wherein at least one of: the first sample time is replaced by the new sample time and the first voltage threshold is replaced by the new voltage threshold; and plotting an error rate on at least one of: a voltage threshold axis comprising the first voltage threshold and the new voltage threshold, and a phase delay axis comprising the first sample time and the new sample time.

13. An error detector instrument comprising:
at least one input to receive a first and second received amplitude of a signal-under-test;
a threshold unit of the input to store at least two voltage thresholds defining at least three voltage ranges;
a symbol unit to associate a unique symbol with each of the voltage ranges;
a reference unit to store a reference test sequence comprising a sequence of symbols;
a resolution unit to compare, at a sample time, the first received amplitude to the voltage thresholds and resolve the first received amplitude to a first received symbol, wherein the first received symbol is the unique symbol associated with the voltage range of the first received amplitude;
the resolution unit to compare, at the sample time, the second received amplitude to the voltage thresholds and resolve the second received amplitude to a second received symbol, wherein the second received symbol is the unique symbol associated with the voltage range of the second received amplitude;
a comparison unit configured to compare the first received symbol with a corresponding symbol of the reference test sequence and count a symbol-error if the first received symbol does not match the corresponding symbol;
and
the comparison unit further configured to compare the second received symbol with a corresponding symbol of the reference test sequence and count a symbol-error if the second received symbol does not match the corresponding symbol.

14. The instrument of claim 13 further comprising:
an error correction unit configured to determine if a symbol-error generated by a Pth received amplitude can be corrected by a forward error correction scheme of the signal-under-test.

15. An error detector instrument comprising:
at least one input channel to sample a first and second received amplitude of a signal-under-test;
a threshold unit to store two or more voltage thresholds;
a reference unit to associate an associated binary reference sequence with each of the voltage thresholds;
a resolution unit to bit-compare, at a sample time, the first received amplitude with each of the voltage thresholds and associate a bit-compare result with each of the voltage thresholds;
the resolution unit to bit-compare, at the sample time, the second received amplitude with each of the voltage thresholds and associate a bit-compare result with each of the voltage thresholds;
and
a comparison unit to compare the bit-compare result of each of the voltage thresholds with a corresponding bit of the associated binary reference sequence and count a threshold-error if the bit-compare result does not match the corresponding bit of the associated binary reference sequence.

16. The instrument of claim 15 further comprising:
an error correction unit configured to determine if the threshold-error generated by a Pth received amplitude can be corrected by a forward error correction scheme of the signal-under-test.

* * * * *